United States Patent [19]
Miyamoto et al.

[11] Patent Number: 5,630,878
[45] Date of Patent: May 20, 1997

[54] LIQUID MATERIAL-VAPORIZING AND SUPPLYING APPARATUS

[75] Inventors: Hideaki Miyamoto; Kohichi Ishikawa; Takeshi Kawano, all of Miyanohigashi-machi, Japan

[73] Assignee: STEC Inc., Kyoto, Japan

[21] Appl. No.: 387,216

[22] Filed: Feb. 13, 1995

[30] Foreign Application Priority Data

| Feb. 20, 1994 | [JP] | Japan | 6-044990 |
| Feb. 20, 1994 | [JP] | Japan | 6-044991 |
| Feb. 20, 1994 | [JP] | Japan | 6-044993 |
| Feb. 20, 1994 | [JP] | Japan | 6-044994 |

[51] Int. Cl.[6] ............................................. C23C 16/00
[52] U.S. Cl. ........................... 118/715; 118/725; 118/726
[58] Field of Search .................................. 118/715, 725, 118/726

[56] References Cited

U.S. PATENT DOCUMENTS

| 5,203,925 | 4/1993  | Shibuya et al. | 118/724 |
| 5,252,134 | 10/1993 | Stauffer       | 118/726 |
| 5,372,754 | 12/1994 | Ono            | 261/142 |
| 5,383,970 | 1/1995  | Asaba et al.   | 118/726 |

Primary Examiner—Felisa C. Garrett
Attorney, Agent, or Firm—Price, Gess & Ubell

[57] ABSTRACT

A liquid flow meter is connected in series with a vaporizer having a vaporizing function and a flow rate-adjusting function and vaporizing a liquid material supplied through said liquid flow meter to compare a flow rate detected by the liquid flow meter with a set value, whereby controlling a quantity of liquid material introduced into a vaporizing chamber provided in said vaporizer on the basis of this comparison result, and thus a flow rate of vaporized gas can be always stably controlled in high-speed response.

20 Claims, 10 Drawing Sheets

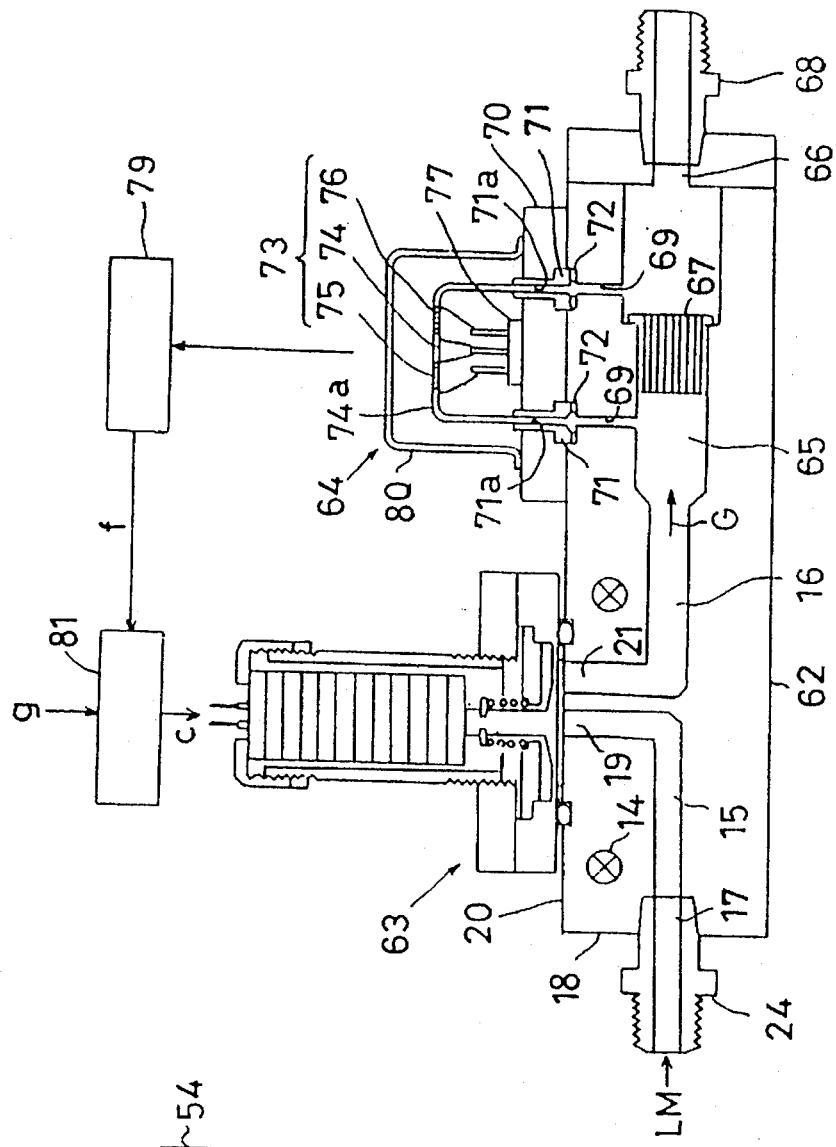

LIQUID MATERIAL-VAPORIZING AND SUPPLYING APPARATUS

BACKGROUND OF THE INVENTION

1. Field of the Invention

The present invention relates to a liquid material-vaporizing and supplying apparatus, for example a liquid material-vaporizing and supplying apparatus provided with a vaporizer capable of quantitatively vaporizing liquid materials, such as tetraethoxysilane, in the production of semiconductors for supplying various kinds of use, such as a chamber of the apparatus for producing semiconductors, with vaporized gases generated in said vaporizer.

2. Description of the Prior Art

A liquid material-vaporizing and supplying apparatus, in which a liquid material tank 103 as a vaporizer housing a liquid material LM therein and heated by a heater 102 is provided in a thermostatic oven 101, a gas flow rate controller 105 integrally comprising a control valve and a flow meter through a stop valve 104 is connected with said liquid material tank 103, and a gas flow meter 107 is connected with an upstream side of said stop valve 104 through a stop valve 106, whereby heating said liquid material LM by said heater 102 under the condition that said stop valve 106 is closed to control a flow rate of a gas G generated at that time by means of said gas flow rate controller 105, as shown in FIG. 15, has been known as one example of the conventional liquid material-vaporizing and supplying apparatus.

In addition, a liquid material-vaporizing and supplying apparatus, in which a liquid material LM is introduced into a vaporizer 112 heated by a heater 111 through a liquid flow rate controller 113 and a stop valve 114 and a carrier gas CG is introduced into said vaporizer 112 through a gas flow rate controller 115 and a stop valve 116 to measure a flow rate of a gas G generated in the vaporizer 112 at that time by means of a gas flow meter 118 provided in a heating pipe 117 on the downstream side of the vaporizer 112, as shown in FIG. 16, has been known as another example of the conventional liquid material-vaporizing and supplying apparatus.

However, in said liquid material-vaporizing and supplying apparatus shown in FIG. 15, disadvantages have occurred in that it is necessary to heat the liquid material tank 103 by the heater 102 and the liquid material LM is always influenced by heat, so that the liquid material LM is thermally decomposed or changed in composition (changed in quality) according to circumstances and impurities are dissolved out from the liquid material tank 103 to mix in the liquid material LM. And, disadvantages have occurred in that the gas flow rate is directly controlled, so that a time from a start of gas generation to a stabilization of gas flow rate is greatly dependent upon a performance of the gas flow rate controller 105 and the gas flow rate controller 105 of high performace so much as that must be used and thus the cost is increased. Moreover, problems have occurred in that a pressure loss in a control valve of the gas flow rate controller 105 comes into question and thus it is necessary to use a control valve having a high CV value in order to suppress said pressure loss to a reduced value, but, as a result, the gas flow rate controller 105 is large-sized and the cost is increased.

Furthermore, in said liquid material-vaporizing and supplying apparatus shown in FIG. 16, a high-temperature portion comprises merely the vaporizer 112 and the liquid material LM-supplying system can be composed under a room-temperature condition, so that a problem that the liquid material LM stored in the liquid material tank is thermally decomposed or changed in composition can be avoided but the gas flow rate is apt to be influenced in stability, reproducibility and the like by the performance of the liquid flow rate controller 113 and the performance of the vaporizer 112 or the temperature condition, so that, in the case where the gas flow rate is monitored, it is necessary to separately provide the liquid material-vaporizing and supplying apparatus with a high-temperature gas flow meter 118, whereby passing the carrier gas CG and the vaporized gas G.

By the way, in both of the above described liquid material-vaporizing and supplying apparatus, the quantity of vaporized gas G generated is measured by the gas flow rate controller 105 or the gas flow meter 118, so that it is necessary to periodically check the gas flow rate controller 105 or the gas flow meter 118 in performance.

For example, in the liquid material-vaporizing and supplying apparatus shown in FIG. 15, an inert gas is introduced as a monitor gas MG under the condition that the stop valve 104 is closed and the stop valve 106 is opened to compare a flow rate value detected by the gas flow rate controller 105 at that time with a flow rate value detected by the gas flow meter 107 provided on the upstream side of the gas flow rate controller 105.

In addition, in the liquid material-vaporizing and supplying apparatus shown in FIG. 16, the liquid material LM is introduced with controlling by the liquid flow rate controller 113 to monitor the gas G generated at that time by the gas flow rate controller 118 provided on the downstream side of the vaporizer 112.

However, in the liquid material-vaporizing and supplying apparatus shown in FIG. 15, a disadvantage has occurred in that the vaporization of liquid material LM must be stopped in order to control the flow rate and thus the continuous control cannot be achieved.

Moreover, in the liquid material-vaporizing and supplying apparatus shown in FIG. 16, although such a disadvantage as in the liquid material-vaporizing and supplying apparatus shown in FIG. 15 does not occur, not only the carrier gas CG is required but also the generated gas G is mixed with the carrier gas CG, in particular in the case where a thermal mass flow meter is used as the gas flow meter 118, the mixture gas of the carrier gas CG and the generated gas G is different in density and specific heat in dependence upon their mixed condition, so that the conversion must be conducted by the use of various factors to determine the quantity of generated gas G.

SUMMARY OF THE INVENTION

The present invention has been achieved paying attenstion to the above described matters and it is a first object of the present invention to provide a compact and inexpensive liquid material-vaporizing and supplying apparatus capable of always controlling a vaporized gas in flow rate with stabilized and high-speed response. It is a second object of the present invention to provide a liquid material-vaporizing and supplying apparatus capable of monitoring a quantity of vaporized gas within a vaporizer by either a liquid flow rate or a gas flow rate and continuously controlling a flow rate without conducting any troublesome conversion. It is a third object of the present invention is to provide a liquid material-vaporizing and supplying apparatus capable of reducing a thermal influence upon a liquid material to be vaporized as far as possible and thus always stably controlling a gas flow rate. It is a fourth object of the present invention to provide a still further compact liquid material-vaporizing and supplying apparatus in addition to said third object of the present invention.

In order to achieve said first object, in said liquid material-vaporizing and supplying apparatus, a liquid flow meter is connected in series with a vaporizer having a vaporizing function and a flow rate-adjusting function and vaporizing a liquid material supplied through said liquid flow meter to compare a flow rate detected by the liquid flow meter with a set value, whereby controlling a quantity of liquid material introduced into a vaporizing chamber provided in said vaporizer on the basis of this comparison result.

In the liquid material-vaporizing and supplying apparatus, not only the vaporizer has the vaporizing function and the flow rate-adjusting function but also its dead volume is remarkably small. Consequently, a speedy response can be always obtained under a stabilized condition. And, since the high-speed response is possible, the vaporized gas can be repeatedly generated for a short time and a pressure-change on the downstream side can be converged in a short time even if it is generated. In addition, the vaporizer has the vaporizing function and the flow rate-adjusting function, so that the apparatus can be small-sized and reduced in cost.

And, in order to achieve a second object, in said liquid material-vaporizing and supplying apparatus, in the case where a liquid flow meter, a vaporizer having a vaporizing function and a flow rate-adjusting function and vaporizing a liquid material supplied through said liquid flow meter and a gas flow meter measuring a quantity of gas discharged from said vaporizer are connected in series in the order described to compare a value of liquid flow rate detected by the liquid flow meter with a set value of liquid flow rate, whereby controlling a quantity of liquid material introduced into the vaporizer on the basis of this comparison result, a gas flow meter is used as a monitor, and, in the case where a value of gas flow rate detected by said gas flow meter is compared with a set value of gas flow rate, whereby controlling a quantity of gas generated in the vaporizer on the basis of this comparison result, the liquid flow meter is used as a monitor.

In the liquid material-vaporizing and supplying apparatus according to this second object, not only said operations and effects according to the first object can be all exhibited but also the following operations and effects can be exhibited. That is to say, in the liquid material-vaporizing and supplying apparatus according to the second object, in the case where the quantity of vaporized gas is controlled by the liquid flow meter, the gas flow meter is used for monitoring the quantity of vaporized gas, and, in the case where the quantity of vaporized gas is controlled by the gas flow meter, the liquid flow meter is used for monitoring the quantity of vaporized gas. Consequently, the quantity of vaporized gas can be controlled in either the liquid flow rate mode or the gas flow rate mode and thus, in the case where the quantity of vaporized gas is controlled in the liquid flow rate mode, the monitoring can be conducted by the gas flow rate, while, in the case where the quantity of vaporized gas is controlled in the gas flow rate mode, the monitoring can be conducted by the liquid flow rate. That is to say, the quantity of vaporized gas can be monitored by the mode different from the controlling mode. Consequently, it is unnecessary to conduct the troublesome conversion which has been necessary in the conventional apparatus. In addition, the quantity of vaporized gas can be continuously controlled.

Furthermore, in order to achieve a third object, in said liquid material-vaporizing and supplying apparatus, a vaporizer having a vaporizing function, and a flow rate-adjusting function and vaporizing a liquid material supplied from a liquid material tank is connected in series with a gas flow meter measuring a quantity of vaporized gas supplied through said vaporizer, a comparative controlling portion comparing a gas flow rate detected by said gas flow meter with a set value to control a quantity of vaporized gas introduced into the gas flow meter on the basis of this comparison result being provided, the vaporizer and the gas flow meter being provided with a heater, respectively, and said liquid material being vaporized within a vaporizing chamber provided within the vaporizer to put out the vaporized gas through the gas flow meter.

Moreover in place of providing the vaporizer and the gas flow meter with said heater, respectively, they may be housed in a thermostatic oven.

In the liquid material-vaporizing and supplying apparatus according to this third object, not only all of the operations and effects according to the first object can be exhibited but also the following operations and effects can be exhibited. That is to say, in the liquid material-vaporizing and supplying apparatus according to the third object, a construction providing the gas flow meter on the latter part (secondary side) of the vaporizer and a construction feedback-controlling the flow rate-adjusting portion of the vaporizer by a detected signal of gas flow rate detected by the gas flow meter in order to control the gas flow rate are provided, so that the gas flow rate can be monitored under the directly vaporized gaseous condition.

Besides, in this liquid material-vaporizing and supplying apparatus according to the third object, a construction arranging a heater for the vaporizer and the gas flow meter, respectively, to supply heat individually and a construction using a thermostatic oven housing the vaporizer and the gas flow meter therein to supply heat simultaneously are adopted, so that a heat capacity of certain condition required for stably vaporizing the respective various liquid materials in the vaporizing portion of the vaporizer or more can be supplied to the liquid materials to easily obtain the vaporized gas. Consequently, a pressure loss in a gas flow rate-controlling valve does not come into question, and, as a result, not only an advantage can be obtained in that it is not necessary to use a large-sized gas flow rate-controlling valve having a high CV value in order to suppress said pressure loss to a remarkably reduced value but also an inside of the gas flow meter can be prevented from dewing.

In addition, in order to achieve a fourth object, in said liquid material-vaporizing and supplying apparatus a vaporizer having a vaporizing function and a flow rate-adjusting function and vaporizing a liquid material supplied from a liquid material tank is connected in series with a gas flow meter measuring a quantity of vaporized gas supplied through said vaporizer under the integrated condition, a comparative controlling portion comparing a gas flow rate detected by said gas flow meter with a set value to control a quantity of vaporized gas introduced into the gas flow meter on the basis of this comparison result being provided, and said liquid material being vaporized within a vaporizing chamber provided within the vaporizer to put out the vaporized gas through the gas flow meter.

Furthermore, a gas purge line for purging a gas-introducing passage by the use of a purge gas may be provided at a place where the vaporizer is connected with the gas flow meter.

In this liquid material-vaporizing and supplying apparatus according to the fourth object, not only all of the operations and effects according to the third object can be exhibited but also the following operations and effects can be exhibited. That is to say, a heating pipe can be made unrequited and a volume of a fluid passage from the vaporizer to the gas flow meter can be remarkably reduced as compared with a construction that an outlet of the vaporizer is connected with an inlet of the gas flow meter through said heating pipe and thus a speed arriving at the gas flow meter is increased to improve the response even if a remarkably reduced flow rate of gas is generated. Consequently, a flow of vaporized gas generated in the vaporizer can be stabilized and thus the vaporized gas, which has been controlled to be constant in flow rate in said comparative controlling portion, can be always stably supplied to various kinds of use point through the gas flow meter.

Since the above described high-speed response can be still further improved in the above described manner, an overshoot of gas flow rate at a rising time of vaporized gas and the like can be improved to measure and control the gas flow rate in remarkably high accuracy by means of the gas flow meter and the comparative controlling portion even in the case where the flow rate of gas supplied to various kinds of use point is set to a very small quantity.

Moreover, a construction supplying heat to the gas flow meter by a heater of the vaporizer can be adopted, so that a heat capacity of certain condition required for stably vaporizing the respective various liquid materials in the vaporizing portion of the vaporizer or more can be supplied to the liquid materials to easily obtain the vaporized gas. Consequently, a pressure loss in a gas flow rate-controlling valve does not come into question, and, as a result, not only an advantage can be obtained in that it is not necessary to use a large-sized gas flow rate-controlling valve having a high CV value in order to suppress said pressure loss to a remarkably reduced value but also an inside of the gas flow meter can be prevented from dewing and thus the apparatus can be small-sized and remarkably reduced in cost.

Besides, in the case where a gas purge line for purging a gas-introducing passage by the use of a purge gas is provided at a place where the vaporizer is connected with the gas flow meter in this integrated liquid material-vaporizing and supplying apparatus, the following operations and effects are exhibited in addition to the above described operations and effects. That is to say, in the case where the liquid material has a remarkably high reactivity, for example oxygen and water remain in lines after the vaporizer, a reaction makes progress in an instant and thus the possibility that solid substances and condensation products are formed is obtained. In this case, it comes into question that the gas flow meter positioned on the secondary side of the vaporizer is clogged and the output is changed. Thus, in order to eliminate this problem, it is effective to sufficiently purge the lines after the vaporizer by means of said gas purge line before the liquid material is flown. Consequently, the line for supplying the apparatus for producing semiconductors with the vaporized gas can be satisfactorily operated by conducting this purge even in the case where air is mixed in the lines after the vaporizer by for example opening the chamber of the apparatus for producing semiconductors after the generation of vaporized gas.

BRIEF DESCRIPTION OF THE DRAWINGS

FIG. 11 is a block diagram showing a third preferred embodiment of the third invention;

FIG. 12 is a drawing roughly showing a liquid material-vaporizing and supplying apparatus according to a first preferred embodiment of a fourth invention;

DESCRIPTION OF THE PREFERRED EMBODIMENTS

Figure 1:
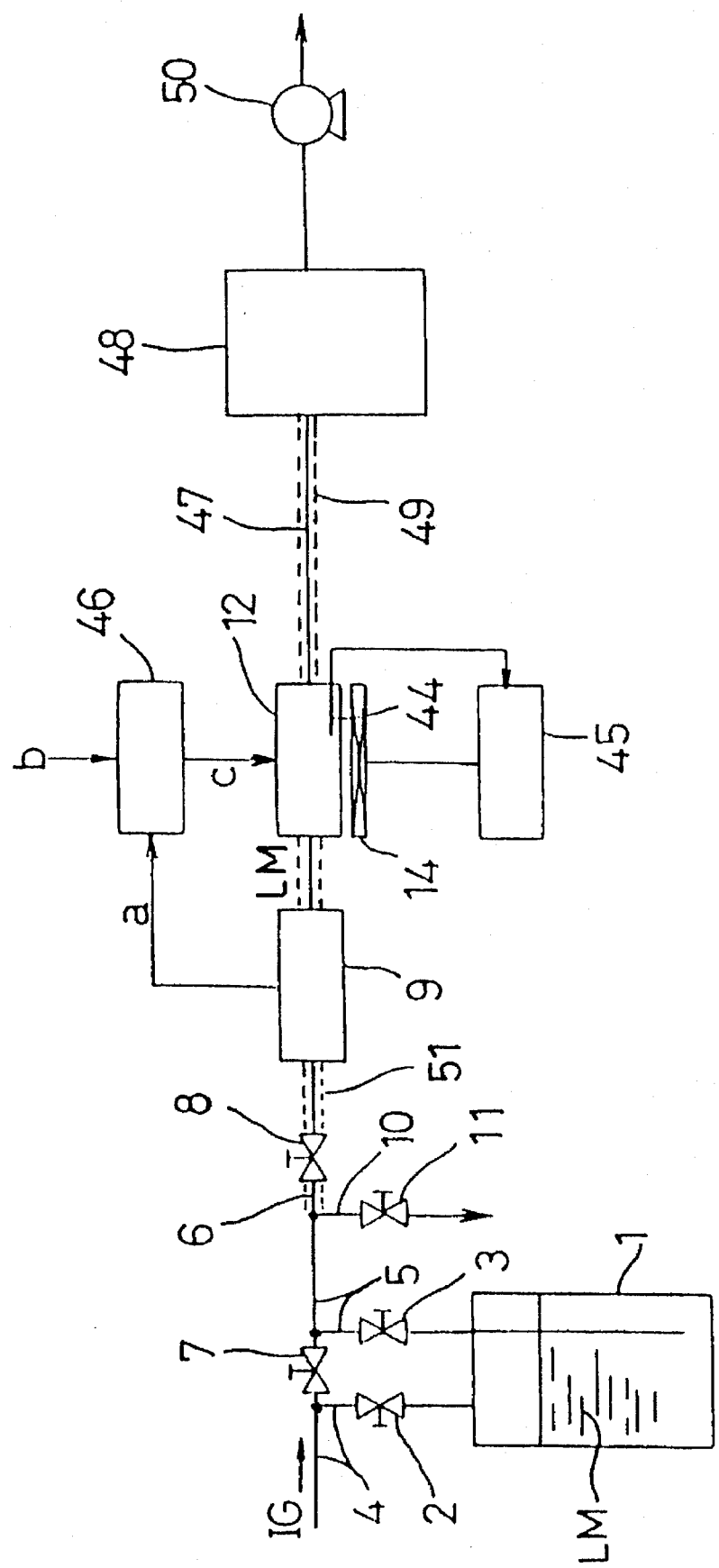
FIG. 1 is a drawing roughly showing one example of a liquid material-vaporizing and supplying apparatus according to a first invention.

FIG. 1 roughly shows one example of a liquid material-vaporizing and supplying apparatus according to a first object. Referring to FIG. 1, reference numeral 1 designates a liquid material tank housing a liquid material LM therein and provided with an inert gas supply pipe 4 and a liquid material outlet pipe 5 provided with a stop valve 2, 3, respectively, connected therewith. Said inert gas supply pipe 4 is connected with an inert gas supply source (not shown) on the other end side (upstream side) thereof while said liquid material outlet pipe 5 is connected with a liquid material supply pipe 6 on the other end side (downstream side) thereof. And, the inert gas supply pipe 4 is connected with the liquid material outlet pipe 5 through a stop valve 7.

Reference numeral 8 designates a stop valve provided in said liquid material supply pipe 6 and a liquid flow meter 9 is connected with the downstream side of said stop valve 8. Said liquid flow meter 9 composes a main portion of said liquid material-vaporizing and supplying apparatus together with a vaporizer 12 which will be mentioned later, so that for example one generally on the market can be used as this liquid flow meter 9. Reference numeral 10 designates a by-pass branchedly connected with a portion where the liquid material outlet pipe 5 is connected with the liquid material supply pipe 6 and connected with a discharging portion (not shown) through a stop valve 11.

Figure 2:
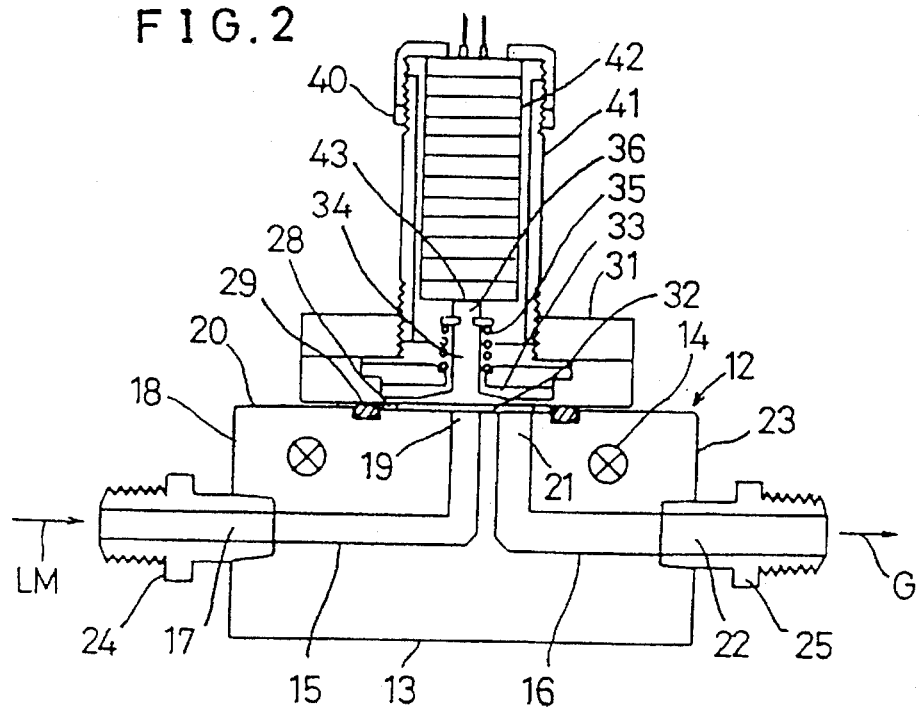
FIG. 2 is a longitudinal sectional view showing one example of a vaporizer used in said liquid material-vaporizing and supplying apparatus.

Reference numeral 12 designates a vaporizer connected with the downstream side of the liquid flow meter 9 and having a construction as shown in for example FIG. 2. That is to say, referring to FIG. 2, reference numeral 13 designates a body block made of metallic materials superior in thermal conductivity, heat resistance and corrosion resistance, for example stainless steels. This body block 13 is provided with a temperature sensor (not in detail shown), such as cartridge heater 14 and thermocouple, for heating the body block 13 on the whole included therein.

Reference numerals 15, 16 designate a liquid material inlet passage and a gas outlet passage formed in a hook-like shape within the body block 13 without crossing each other. That is to say, one opening (liquid material inlet port) 17 of said liquid material inlet passage 15 is formed on one side surface 18 of the body block 13 and the other opening 19 of the liquid material inlet passage 15 is formed on an upper surface 20 meeting at right angles with said side surface 18 so as to introduce a liquid material LM into a vaporizing chamber 32 which will be mentioned later. In addition, one opening 21 of said gas outlet passage 16 is formed on said upper surface 20 and the other opening (gas outlet port) 22 of the gas outlet passage 16 is formed on a side surface 23 opposite to the side surface 18 so as to lead a gas G generated in said vaporizing chamber 32 out of the body block 13. Reference numerals 24, 25 designates a joint connected with said liquid material inlet port 17 and said gas outlet port 22, respectively.

Figure 3:
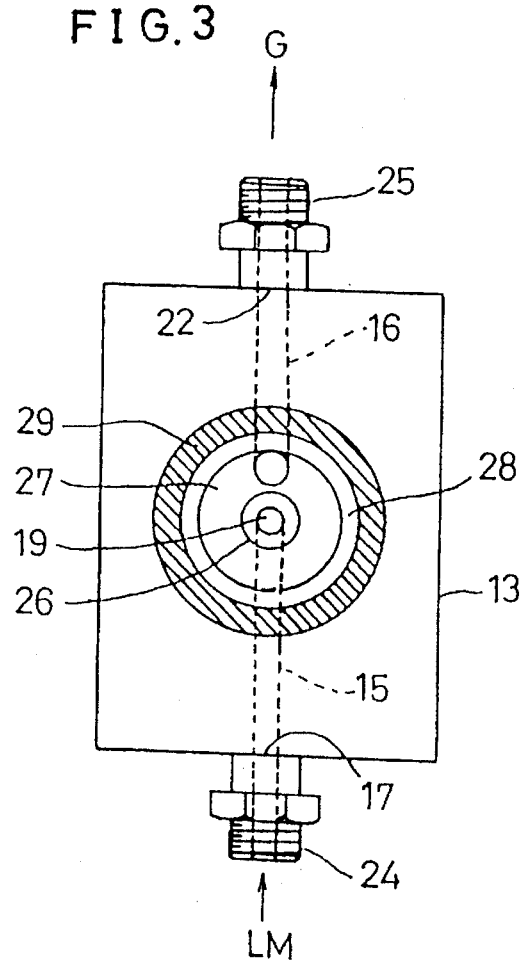
FIG. 3 is a drawing showing a plane construction of a body block in said vaporizer.
Figure 4:
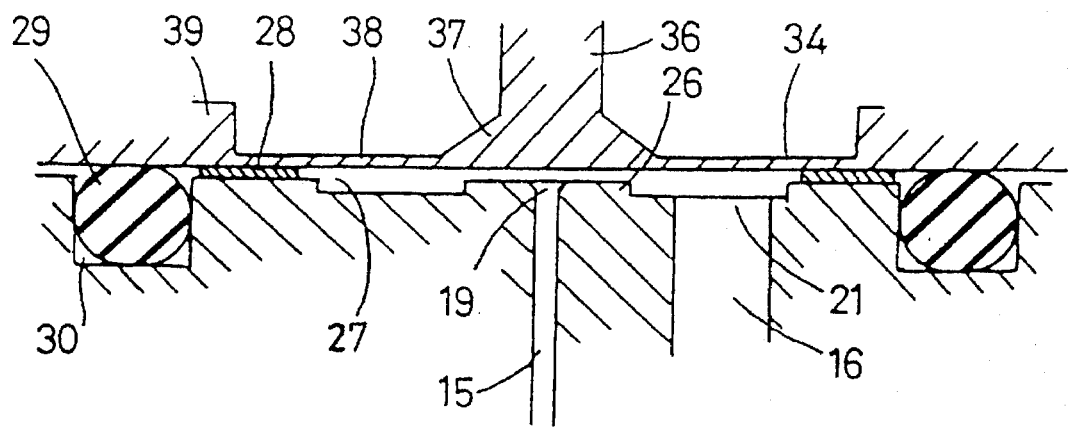
FIG. 4 is an enlarged longitudinal sectional view showing an upper construction of said body block.

A construction on the upper surface 20 of the body block 13 will be below in detail described with reference to also FIG. 3 showing a plane construction of the body block 13 and FIG. 4 showing an upper construction of the body block 13. Said opening 19 on the upper surface 20 of the liquid material inlet port 15 is opened in for example a central portion 26 of the upper surface 20. A groove 27 concentric with the opening 19 is formed around this central portion 26 and an opening 21 of the gas outlet passage 16 is opened so as to face to said groove 27. And, an inside diameter of the opening 19 is for example about 0.5 to 1.5 mm, an inside diameter of said opening 21 being for example about 2 to 4 mm, and a distance from the opening 19 to the groove 27 formed concentrically with the opening 19 being about 3 to 6 mm. It goes without saying that these dimensions are suitably determined in dependence upon a quantity of said liquid material LM introduced through the liquid material inlet port 17.

And, a ring spacer 28 made of stainless steels having a thickness of for example about 20 to 80 μm is provided out of the groove 27 so as to surround the groove 27, as shown in FIG. 4. This spacer 28 engagedly holds a lower periphery of a diaphragm 34 which will be mentioned later. Reference numeral 29 designates a sealing member provided so as to be engaged with a groove 30 provided out of the spacer 28 so as to surround the spacer 28 and a lower surface of a valve block 31, which will be in detail mentioned later, is engaged with this sealing member 29.

Referring to FIG. 2 again, reference numeral 31 designates a valve block placed on the upper surface 20 of the body block 13 and made of materials superior in thermal conductivity and corrosion resistance such as stainless steels. The vaporizing chamber 32 is formed between this valve block 31 and the upper surface 20. That is to say, a lower periphery of a diaphragm 34 is engaged with the spacer 28 within an internal space 33 of the valve block 31 so as to be always energized upward by means of a spring 35, whereby forming the vaporizing chamber 32 by this diaphragm 34 and the spacer 28.

The diaphragm 34 is made of materials suprior in heat resistance and corrosion resistance and provided with a valve portion 37 engaged with or separated from the central portion 26 of the upper surface 20 to open and close the opening 19 of the liquid material inlet passage 15 formed below a shaft portion 36 thereof, a thin-walled portion 38 formed on a circumference of said valve portion 37 and a thick-walled portion 39 formed on a circumference of said thin-walled portion 38. In usual, the valve portion 37 is separated from the central portion 26 by being energized upward by means of said spring 35, but, when said shaft portion 36 is subjected to a downward pressing force, the valve portion 37 is closely engaged with the central portion 26 to close the opening 19.

In this preferred embodiment, the diaphragm 32 is used as a member forming a valve for adjusting a flow rate of the liquid material LM and shutting off the liquid material LM as well as the vaporizing chamber 32 of the liquid material LM supplied to an inside of the body block 13 through the liquid material inlet port 17. Consequently, in order to more surely conduct the above described shut-off, a flat lower surface of the diaphragm 34 is coated or lined with fluororesins. In addition, in place of this coating and the like, the diaphragm 34 itself may be made of fluororesins.

And, the lower peripheral portion of diaphragm 34 is engaged with the spacer 28 so that the shaft portion 36 of the diaphragm 32 may be positioned in the upper part and all of the openings 19, 21 and the groove 27 formed on the upper surface 20 of the body block 13 are included within the vaporizer 32 formed on the downstream side of the diaphragm 32. In short, the opening 19 of the liquid material inlet passage 15 is comminicated with the opening 21 of the liquid material outlet passage 16 within the vaporizing chamber 32. And, this diaphragm 34 is pressed by an actuator 40, which will be mentioned later, to adjust an openness of the opening 19 for introducing the liquid material LM into the vaporizing chamber 32 or closing the opening 19, whereby controlling a quantity of liquid material LM introduced into the vaporizing chamber 32.

Reference numeral 40 designates an actuator pressing the diaphragm 32 downward to give a distortion to it. In this preferred embodiment, a piezostack 42 with a plurality of piezoelements piled is provided within a housing 41 standing on the valve block 31 to engage a pressing portion 43 of said piezostack 42 with the shaft portion 36 of the diaphragm 34, whereby forming a piezoactuator.

An operation of the vaporizer 12 having the above described construction will be below described with reference to also FIG. 5. As above described, the diaphragm 34 is always energized upward by an energizing force of the spring 35 and the valve portion 37 of the diaphragm 34 is separated from the upper surface 20 of the body block 13 with a slight gap, as shown in FIG. 4. Consequently, the openings 19, 20 on the upper sides of the liquid material inlet passage 15 and the gas outlet passage 16 are opened.

Figure 5:
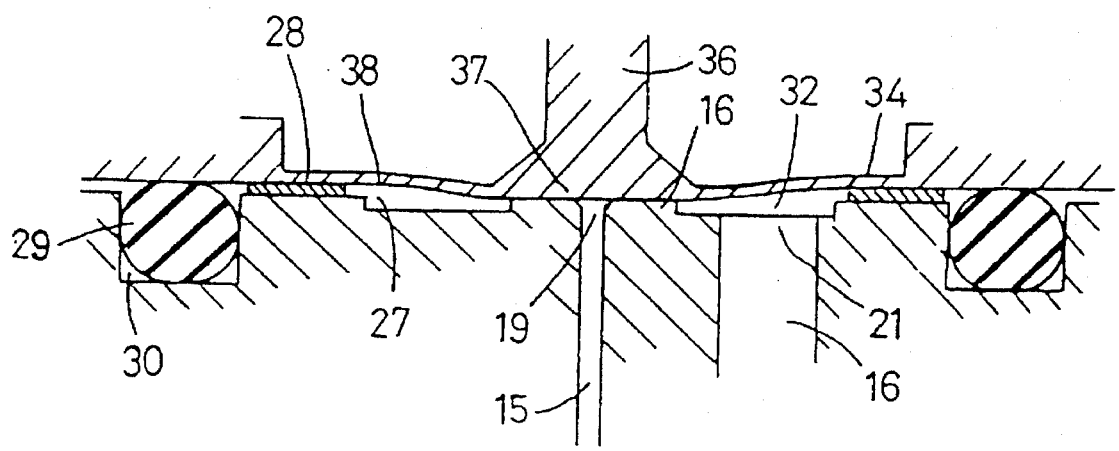
FIG. 5 is an operation diagram of the vaporizer.

And, upon electrifying the heater 14 and applying an appointed DC voltage to the piezostack 42, the diaphragm 34 is pressed downward and a distortion is given to the valve portion 37 so that the valve portion 37 may be engaged with the central portion 26 on the upper surface 20 of the body block 13, as shown in FIG. 5, to close the opening 19 of the liquid material inlet passage 15, whereby bringing about a liquid-shutting off condition. Consequently, even though the liquid material LM is supplied to the vaporizer 12 at a pressure of for example about 3 kg/cm2, the liquid material LM does not flow into the vaporizing chamber 32.

Then, upon slightly reducing said voltage applied to the piezostack 42 than the above described applied voltage to reduce the pressing force applied to the diaphragm 34, the closure of the opening 19 by the diaphragm 34 is released to form a slight gap between the valve portion 37 and the central portion 26, whereby introducing the liquid material LM into the vaporizing chamber 32 through said gap. And, the liquid material LM is speedily vaporized by a pressure-drop accompanied by the flow thereof into the vaporizing chamber 32 and a heating (to for example about 100° C.) thereof by means of the heater 14 to flow the vaporized gas G toward the side of the gas outlet port 22 through the gas outlet passage 16.

As understood from the above description, in the vaporizer 12, not only the liquid material LM is speedily vaporized by said pressure-drop thereof accompanied by the flow thereof into the vaporizing chamber 32 and said heating thereof by means of the heater 14 but also the vaporized gas G can be speedily and efficiently discharged due to a remarkably small volume of the vaporizing chamber 32. And, the diaphragm 34 serves also as a valve adjusting the flow rate of the liquid material LM and a constituent member of the vaporizing chamber 32 vaporizing the liquid material LM, so that a liquid-remaining portion is not formed between the flow rate-adjusting valve and the vaporizing chamber differently from in the conventional vaporizer and thus bubbles are not accumulated and grown. As a result, the desired flow rate of gas G can be stably supplied.

As above described, the vaporizer 12 has both a vaporizing function and a flow rate-adjusting function, so that a high-speed response becomes possible and the repeated short-time generation of the vaporized gas becomes possible. In addition, the vaporizer 12 can be compactized and reduced in cost.

Referring to FIG. 1 again, reference numeral 44 designates a sensor detecting a temperature of the body block 13 in the vaporizer 12 and an output of said sensor 44 is put in a temperature-adjusting device 45. And, the heater 14 heating the body block 13 is controlled on the basis of an output signal from said temperature-adjusting device 45.

And, reference numeral 26 designates a comparative controlling portion in which a control signal c is put out to the actuator 40 in the vaporizer 12 on the basis of a flow rate value (detected flow rate) a of the liquid material LM detected by the liquid flow meter 9 and the set value (set flow rate) b. The actuator 40 is driven on the basis of said control signal c from the comparative controlling portion 46 to control the openness of the opening 19 of the vaporizing chamber 32.

Reference numeral 47 designates a gas supply passage for supplying a chamber 48 of a reduced pressure CVD apparatus used in the production of for example semiconductors with the gas G generated in the vaporizer 12. Said gas supply passage 47 is provided with a heater 49 for preventing the gas G from being condensed wound around an outer periphery thereof. Reference numeral 50 designates a suction pump provided on the downstream side of said chamber 48.

An operation of the above described liquid material-vaporizing and supplying apparatus will be below described. An inert gas IG, such as nitrogen or helium, is supplied to the liquid material tank 1 at an appointed pressure under the condition that the stop valves 7, 11 are closed while the stop valves 2, 3, 8 are opened. The liquid material LM is sent toward the liquid flow meter 9 by introducing said inert gas IG into the liquid material tank 1 under pressure.

The signal a expressing the detected flow rate of the liquid material LM is put out from the liquid flow meter 9 to be put in the comparative controlling portion 46. Since the set value signal b has been put in this comparative controlling portion 46, the signal a is compared with the set value signal b to send the control signal c on the basis of the comparison result to the actuator 40 of the vaporizer 12, whereby driving the actuator 40 to adjust the openness of the opening 19 of the vaporizing chamber 32.

And, the appointed flow rate of liquid material LM flows into the vaporizing chamber 32 of the vaporizer 12, the liquid material LM being speedily vaporized by the pressure-drop and the heating by means of the heater 14, and the vaporized gas G flowing to the side of the gas outlet port 22 through the gas outlet passage 16. And, the gas G is supplied to the chamber 48 through the heating pipe 47.

In the above described liquid material-vaporizing and supplying apparatus, not only the liquid material LM can be smoothly vaporized but also a heightened pressure is not suddenly transferred to the liquid material-supplying side even if a pressure-rise occurs by the vaporization, so that no bad influence is given to the liquid material supply line. And, the gas G generated by the vaporization is speedily led to the downstream side to be supplied to the chamber 48 provided on the downstream side.

And, in the above described liquid material-vaporizing and supplying apparatus, the liquid material LM is not always heated but point-heated, so that the thermal decomposition and change in quality are avoided. And, the flow rate of liquid material LM is directly controlled, so that its absolute quantity can be stably supplied. In addition, the maintenance of the apparatus on the whole can be easily achieved.

And, the vaporizing conditions of the liquid material LM are depend upon the pressure conditions and temperature conditions on and after the vaporizer 12, the physical properties (vapor pressure, specific heat and the like) of the liquid material LM and the temperature and construction of the vaporizer 12.

Furthermore, the following minimum conditions are listed up for the more stabilized vaporization of the liquid material LM.

(1) The vapor pressure of the liquid material LM is higher than the pressure on and after the vaporizer 12 at the temperature of the vaporizer 12.

(2) The liquid material inlet passage 15 within the vaporizer 12 is heated so that the energy sufficient for the vaporization may be given to the liquid material LM to be introduced into the vaporizing chamber 32.

(3) The construction of the flow rate-adjusting portion of the vaporizer 12

In the above described liquid material-vaporizing and supplying apparatus, all of the above described conditions (1) to (3) are satisfied, so that not only the desired flow rate of gas G can be stably supplied for a long time but also the gas can be repeatedly generated and supplied in good reproducibility.

The object invention is not limited by the above described preferred embodiment but various modifications are possible. That is to say, the vaporizing chamber 32 may be formed within the body block 13. And, the heater 14 may be a plate heater and the heater 14 is not always provided within the body block but it is sufficient that the body block 13, in particular the vicinity of the vaporizing chamber 32, can be heated.

And, it is not necessary to form the liquid material inlet passage 15 and the gas outlet passage 16 in a hook-like shape but they may be straight. In addition, the the actuator 40 may be electro-magnetic type or thermal type.

Moreover, the liquid material LM is not limited by those which are liquidous at normal temperature and pressure but may be those which are gaseous at normal temperature and pressure but liquidous at normal temperature by the suitable pressurization.

And, referring to FIG. 1, a heater designated by reference numeral 51 may be wound around the liquid material supply pipe 6 to preliminarily heat the liquid material LM supplied to the vaporizer 12, whereby preliminarily giving the thermal energies required for the vaporization to the liquid material LM. In case of this construction, the vaporization within the vaporizer 12 can be conducted more efficiently and thus the larger flow rate of gas G can be obtained.

Figure 6:
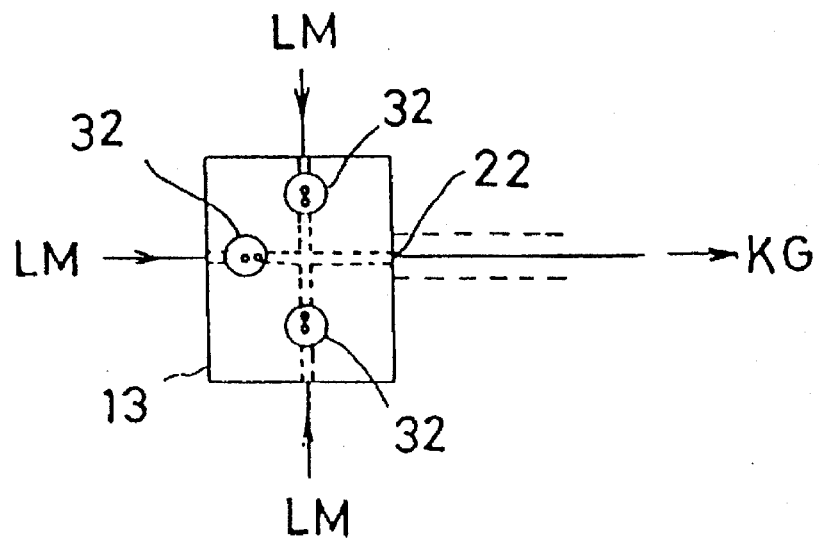
FIG. 6 is a drawing roughly showing a plane construction of a body block according to another preferred embodiment.

In addition, as shown in FIG. 6, not only one body block 13 may be provided with a plurality of vaporizing chambers 32 but also the liquid materials LM different from each other may be introduced into the respective vaporizing chambers 32 to join them on the upstream side of the gas outlet port 22, whereby taking out the mixture gas KG. In this case, it is preferable that each vaporizing chamber 32 is provided with an actuator operating independently.

Figure 7:
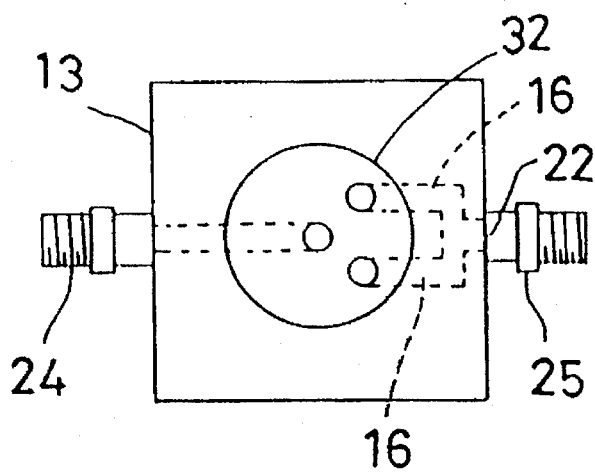
FIG. 7 is a drawing roughly showing a plane construction of a body block according to still another preferred embodiment.

Furthermore, as shown in FIG. 7, a plurality of gas outlet passages 16 (two in the preferred embodiment shown) may be provided between the vaporizing chamber 32 and the gas outlet port 22. In this case, the pressure-loss of the gas outlet passage 16 is reduced and the pressure within the vaporizing chamber 32 is lowered, so that the vaporizing efficiency can be improved and thus the quantity of liquid material LM introduced into the vaporizing chamber 32 can be increased so much as that.

And, the body block 13 may be made of ceramics and heat-resisting resins and the comparative controlling portion 46 may be included in the liquid flow meter 9.

As above described, in the liquid material-vaporizing and supplying apparatus according to the first object, the liquid material is liquidous and is at room temperature until it is introduced into the vaporizing chamber, so that the thermal decomposition and change in composition of the liquid material do not come into question differently from in the conventional liquid material-vaporizing and supplying apparatus. And, in this liquid material-vaporizing and supplying apparatus, the internal volume of the vaporizing chamber is remarkably small, so that the response time from the start of the vaporization of liquid material to the stabilization of gas flow rate can be shortened as far as possible and thus the repeated generation for a short time becomes possible. Moreover, in this liquid material-vaporizing and supplying apparatus, the vaporizer has the vaporizing function and the flow rate-adjusting function, so that the apparatus can be small-sized and reduced in cost.

Figure 8:
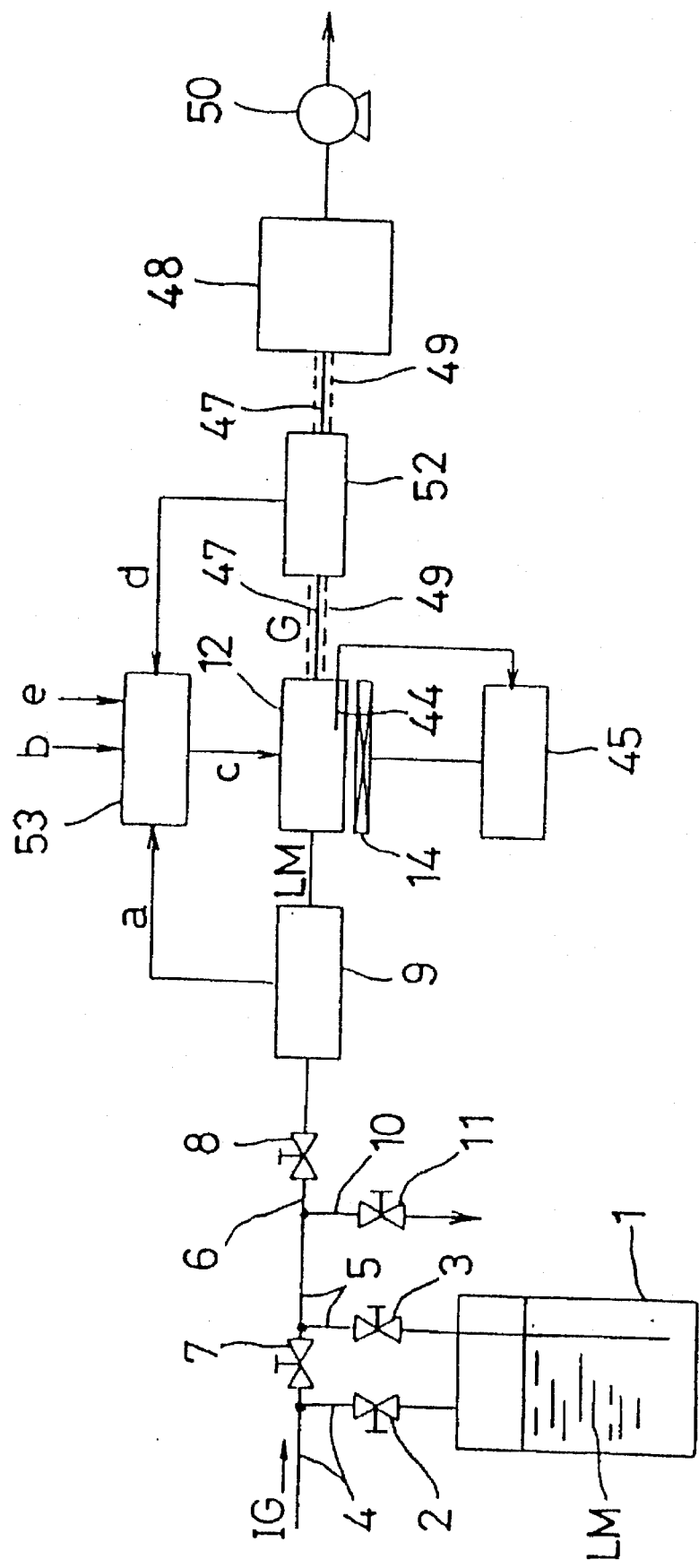
FIG. 8 is a drawing roughly showing one example of a liquid material-vaporizing and supplying apparatus according to a second invention.

FIG. 8 roughly shows one example of the liquid material-vaporizing and supplying apparatus according to the second object. Referring to FIG. 2, the same members as in FIG. 1 are designated by the same reference numerals as in FIG. 1, so that their descriptions are omitted. In addition, a vaporizer in this invention is quite same as the vaporizer 12 according to the first invention in details thereof, so that they are designated by the same reference numerals as in the vaporizer 12 according to the first invention and their dsecriptions are omitted.

Referring to FIG. 8, reference numeral 52 designates a gas flow meter provided in a gas supply passage 27 on the downstream side of the vaporizer 12. Gas flow meters on the market, such as gas mass flow meter, can be used as said gas flow meter 52.

Reference numeral 53 designates a comparative controlling portion in which the flow rate value (detected value of liquid flow rate) a of the liquid material LM detected by the liquid flow meter 9 provided on the upstream side of the vaporizer 12 is compared with the set flow rate value (set value of liquid flow rate) b or a flow rate value (set value of gas flow rate) d of gas G detected by said gas flow meter 52 provided on the downstream side of the vaporizer 12 is compared with a set flow rate value (set value of gas flow rate) e to put out the controlling signal c to the actuator 40 in the vaporizer 12. The actuator 40 is driven on the basis of the controlling signal c from said comparative controlling portion 53 to control the openness of the opening 19 of the vaporizing chamber 32.

And, in this preferred embodiment, in the case where the detected value of liquid flow rate a detected by the liquid flow meter 9 is compared with the set value of liquid flow rate b to control the quantity of liquid material LM introduced into the vaporizing chamber 32 provided in the vaporizer 12 on the basis of this comparison result, the gas flow meter 52 is used as a monitor, while, in the case where the detected value of gas flow rate d detected by the gas flow meter 52 is compared with the set value of gas flow rate e to control the quantity of gas generated in the vaporizer 12 on the basis of this comparison result, the liquid flow meter is used as a monitor.

In short, in this liquid material-vaporizing and supplying apparatus according to the second object, the the quantity of gas vaporized in the vaporizer 12 can be controlled in either the liquid flow rate mode or the gas flow rate mode, that is, in the case where the quantity of vaporized gas is controlled in the liquid flow rate mode, the monitoring can be conducted by the gas flow rate, while, in the case where the quantity of vaporized gas is controlled in the gas flow rate mode, the monitoring can be conducted by the liquid flow rate. That is to say, the quantity of vaporized gas can be monitored by the mode different from the controlling mode.

An operation of the above described liquid material-vaporizing and supplying apparatus will be below described. An inert gas IG, such as nitrogen or helium, is supplied to the liquid material tank 1 at an appointed pressure under the condition that the stop valves 7, 11 are closed while the stop valves 2, 3, 8 are opened. The liquid material LM is sent toward the liquid flow meter 9 by introducing said inert gas IG into the liquid material tank 1 under pressure.

And, in the case where the quantity of vaporized gas is adjusted by the liquid flow rate, the signal a expressing the detected flow rate of the liquid material LM is put out from the liquid flow meter 9 to be put in the comparative controlling portion 47. Since the set value signal b has been put in this comparative controlling portion 47, the signal a is compared with the set value signal b to send the control signal c on the basis of the comparison result to the actuator 40 of the vaporizer 12, whereby driving the actuator 40 to adjust the openness of the opening 19 of the vaporizing chamber 32.

And, the appointed flow rate of liquid material LM flows into the vaporizing chamber 32 of the vaporizer 12, the liquid material LM being speedily vaporized by the pressure-drop and the heating by means of the heater 14, and the vaporized gas G flowing to the side of the gas outlet port 22 through the gas outlet passage 16. And, the gas G is supplied to the chamber 48 through the heating pipe 47.

At this time, the gas flow meter 52 provided on the downstream side of the vaporizer 12 functions as the flow rate monitor of the vaporized gas G.

Next, in the case where the quantity of vaporized gas is controlled by the gas flow rate, the flow rate of gas G generated in the vaporizer 12 detected in the gas flow meter 52 and the detected value of flow rate d is put in said comparative controlling portion 53. Since the set value signal e has been put in this comparative controlling portion 53, the detected value of flow rate d is compared with the set value signal e to send the control signal c on the basis of the comparison result to the actuator 40 of the vaporizer 12, whereby driving the actuator 40 to adjust the openness of the opening 19 of the vaporizing chamber 32. As a result, the liquid material LM introduced into the vaporizing chamber 32 is speedily vaporized by the pressure-drop and the heating by means of the heater 14 as same as described above and the gas G generated by the vaporization flows toward the side of the gas outlet port 22 through the gas outlet passage 16. And, the gas G is supplied to the chamber 48 through the heating pipe 47.

At this time, the liquid flow meter 9 provided on the upstream side of the vaporizer 12 functions as the flow rate monitor of the liquid material LM.

As above described, in the above described liquid material-vaporizing and supplying apparatus, in the case where the quantity of vaporized gas is controlled by the liquid flow rate, the monitoring can be conducted by the gas flow rate, while, in the case where the quantity of vaporized gas is controlled by the gas flow rate, the monitoring can be conducted by the liquid flow rate. That is to say, the flow rates of the same one material under the conditions (liquidous and gaseous) different in physical property can be monitored. In other words, the flow rate can be monitored by means of the flow meters different in detecting mode (liquid flow meter 9, gas flow meter 52), so that not only the liquid material-vaporizing and supplying apparatus can be improved in reliability but also the abnormality can be early detected.

In addition, the second object is not limited by the above described preferred embodiment but various modified preferred embodiments of the first object can be applied as they are.

As above described, the liquid material-vaporizing and supplying apparatus according to the second object exhibits the following effects in addition to the effects of the first object. That is to say, in the liquid material-vaporizing and supplying apparatus according to the second object, the quantity of vaporized gas in the vaporizer can be always monitored by either the liquid flow rate or the gas flow rates so that the control can be conducted without stopping the generation of gas and thus the flow rate can be continuously controlled without conducting the troublesome conversion. And, according to this invention, the liquid material-vaporizing and supplying apparatus of high reliability can be obtained and it is effectively used in particular for the depressurized CVD.

Figure 9:
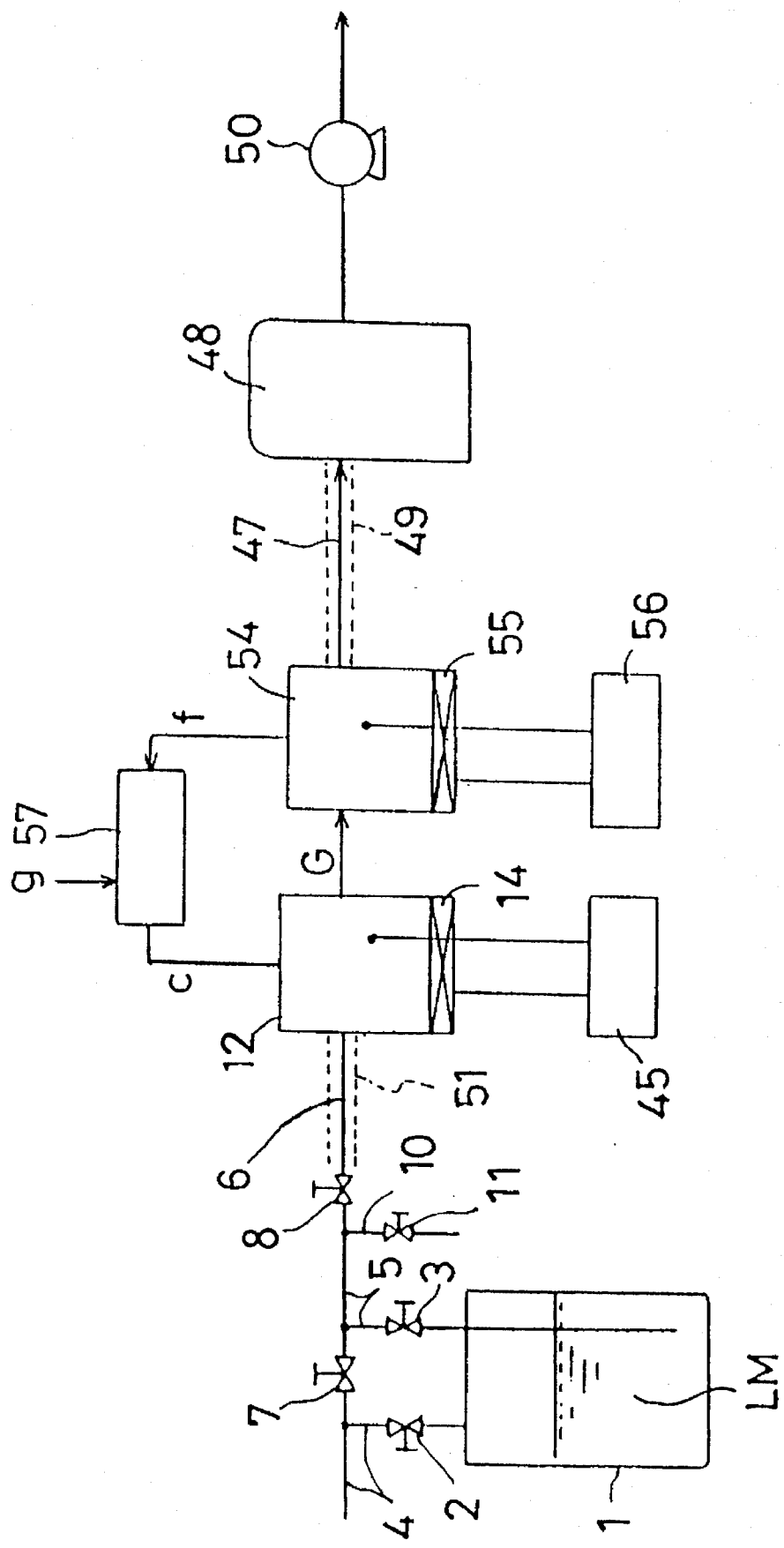
FIG. 9 is a drawing roughly showing a liquid material-vaporizing and supplying apparatus according to a first preferred embodiment of a third invention.

FIG. 9 roughly shows of a liquid material-vaporizing and supplying apparatus according to a first preferred embodiment of the third object. Referring to FIG. 9, the same members as in FIG. 1 and FIG. 8 are designated by the same reference numerals as in FIG. 1 and FIG. 8, so that their descriptions are omitted. In addition, a vaporizer in this invention is quite same as the vaporizer 12 according to the first object in details thereof, so that they are designated by the same reference numerals as in the vaporizer 12 according to the first invention and their descriptions are omitted.

Referring to FIG. 9, reference numeral 54 designates a gas flow meter provided on the downstream side of the vaporizer 12, reference numeral 55 designating a plate heater for heating said gas flow meter 54, and reference numeral 56 designating a temperature-adjusting device. Reference numeral 57 designates a comparative controlling portion in which a detected flow rate of gas f detected by the gas flow meter 54 is compared with a set value g to control the quantity of vaporized gas G introduced into the gas flow meter 54 on the basis of this comparison result.

In this first preferred embodiment of the third object, not only the gas flow meter 54 is provided on the latter part (secondary side) of the vaporizer 12, the vaporized material LM being supplied to the vaporizer 12 from the liquid material tank T under the liquidous condition, and the liquid material LM being vaporized in the vaporizing chamber 32 during the time when the liquid material LM passes through the vaporizer 12 to send the vaporized gas G generated at that time to the gas flow meter 54 but also the flow rate-adjusting portion comprising the diaphragm 34 of the vaporizer 12 and the actuator 40 is feedback-controlled by said detected signal f of detected flow rate of gas detected by the gas flow meter 54 in order to control the gas flow rate, whereby the gas flow rate can be directly monitored under the vaporized gaseous condition.

Moreover, the vaporizer 12 and the gas flow meter 54 is provided with the heater 14 and the heater 55, respectively, to individually supply heat, so that a heat capacity of certain condition required for stably vaporizing the liquid material LM in the vaporizing chamber 32 of the vaporizer 12 or more can be supplied to the liquid material LM to easily obtain the vaporized gas G. Consequently, the pressure-drop of the gas flow rate control valve does not come into question and thus not only an advantage occurs in that it becomes unnecessary to use a large-sized gas flow rate control valve having a high CV value in order to suppress the pressure-drop to a remarkably low value but also the dewing within the gas flow meter 54 can be prevented.

As a result, in the liquid material-vaporizing and supplying apparatus according to this preferred embodiment, the chamber 28 provided on the downstream side of the vaporizer 12 can be stably supplied with an appointedly controlled flow rate of vaporized gas G.

Figure 10:
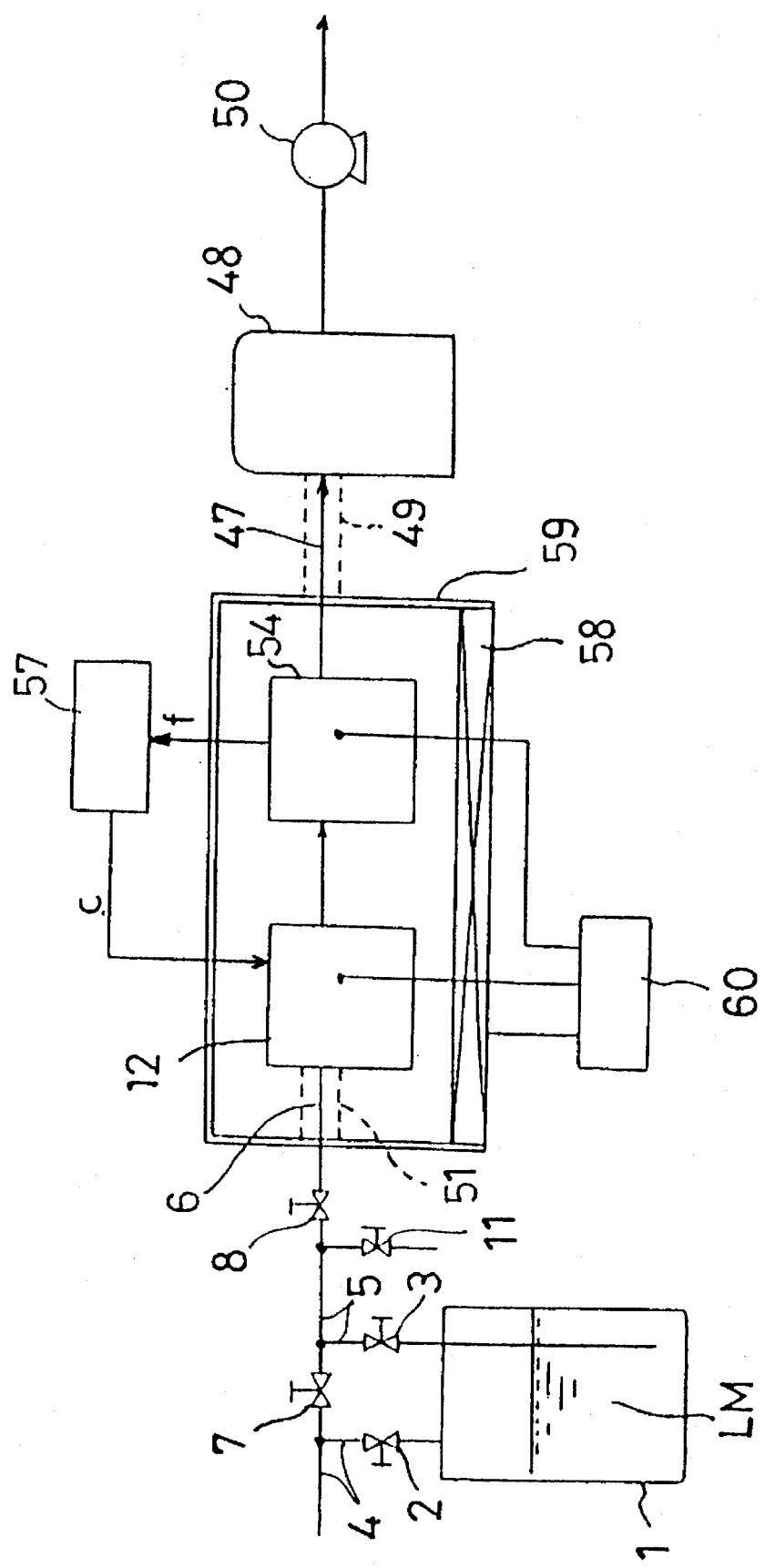
FIG. 10 is a drawing roughly showing a liquid material-vaporizing and supplying apparatus according to a second preferred embodiment of said third invention.

FIG. 10 roughly shows a liquid material-vaporizing and supplying apparatus according to a second preferred embodiment of the third object. Referring to FIG. 10, the same members as in FIG. 9 are designated by the same reference numerals as in FIG. 9, so that their descriptions are omitted.

In said second preferred embodiment shown in FIG. 10, the vaporizer 12 and the gas flow meter 54 are provided within a thermostatic oven 59 provided with a heater, such as plate heater, and a temperature-adjusting device 60 for adjusting temperatures within the body block 13 of the vaporizer 12 and the gas flow meter 54 is provided.

In the second preferred embodiment having the above described construction, the vaporizer 12, the gas flow meter 54 and pipe systems are provided within said thermostatic oven 59 to maintain them at an appointed temperature and the flow rate-adjusting portion comprising the diaphragm 34 of the vaporizer 12 and the actuator 40 is feedbacked from the detected signal f of flow rate of gas detected by the gas flow meter 52, whereby the gas flow rate can be directly monitored under the vaporized gaseous condition.

In addition, a heat capacity of certain condition required for stably vaporizing the liquid material LM in the vaporizing chamber 32 of the vaporizer 12 or more can be supplied to the liquid material LM to easily obtain the vaporized gas G. Consequently, the pressure-drop of the gas flow rate control valve does not come into question and thus not only an advantage occurs in that it becomes unnecessary to use a large-sized gas flow rate control valve having a high CV value in order to suppress the pressure-drop to a remarkably low value but also the dewing within the gas flow meter 54 can be prevented.

In addition, although the comparative controlling portion 57 is formed separately from the gas flow meter 54 in the above described respective preferred embodiments, the comparative controlling portion 57 may be included in the gas flow meter 54.

Furthermore, in the above described respective preferred embodiments, in order to prevent the dewing in the pipe systems on and after the vaporizer 12, a tape heater and the like may be wound around the pipe systems including the gas flow meter 54 to conduct the package temperature-control.

And, as shown in FIG. 11, a gas purge line 61 is provided between the vaporizer 12 and the gas flow meter 54 to introduce a purge gas PG into the latter part of the vaporizer 12.

Moreover, the third object is not limited by the above described preferred embodiment but various modified preferred embodiments of the first object can be applied as they are.

As above described, the liquid material-vaporizing and supplying apparatus according to the third object exhibits the following effects in addition to the effects of the first object. That is to say, with the liquid material-vaporizing and supplying apparatus according to the third object, the construction that the vaporizer and the gas flow meter is provided with the heater, respectively, to individually supply heat and the construction that one thermostatic oven housing the vaporizer and the gas flow meter therein is used to simultaneously supply heat are adopted, so that a heat capacity of certain condition required for stably vaporizing various kinds of liquid material in the vaporizing portion of the vaporizer or more can be supplied to the liquid material to easily obtain the vaporized gas. Consequently, the pressure-drop of the gas flow rate control valve does not come into question and thus not only an advantage occurs in that it becomes unnecessary to use a large-sized gas flow rate control valve having a high CV value in order to suppress the pressure-drop to a remarkably low value but also the dewing within the gas flow meter 52 can be prevented.

FIG. 12 roughly shows a liquid material-vaporizing and supplying apparatus according to a first preferred embodiment of the fourth object. Referring to FIG. 12, the same members as in FIG. 1, FIG. 8 and FIG. 9 are designated by the same reference numerals as in FIG. 1, FIG. 8 and FIG. 9 so that their descriptions are omitted.

Referring to FIG. 12, reference numeral 62 designates a rectangular parallelpiped-shaped body block made of metallic materials superior in thermal conductivity, heat resistance and corrosion resistance, for example stainless steels. Said body block 62 is provided with a vaporizer 63 having the same construction as that of the vaporizer 12 according to the first invention and the vaporizing function and the flow rate-adjusting function for vaporizing the liquid material supplied from the liquid material tank (not shown) and a gas flow meter 64 measuring the vaporized gas G generated by means of said vaporizer 63 under the condition that they are connected in series.

Figure 13:
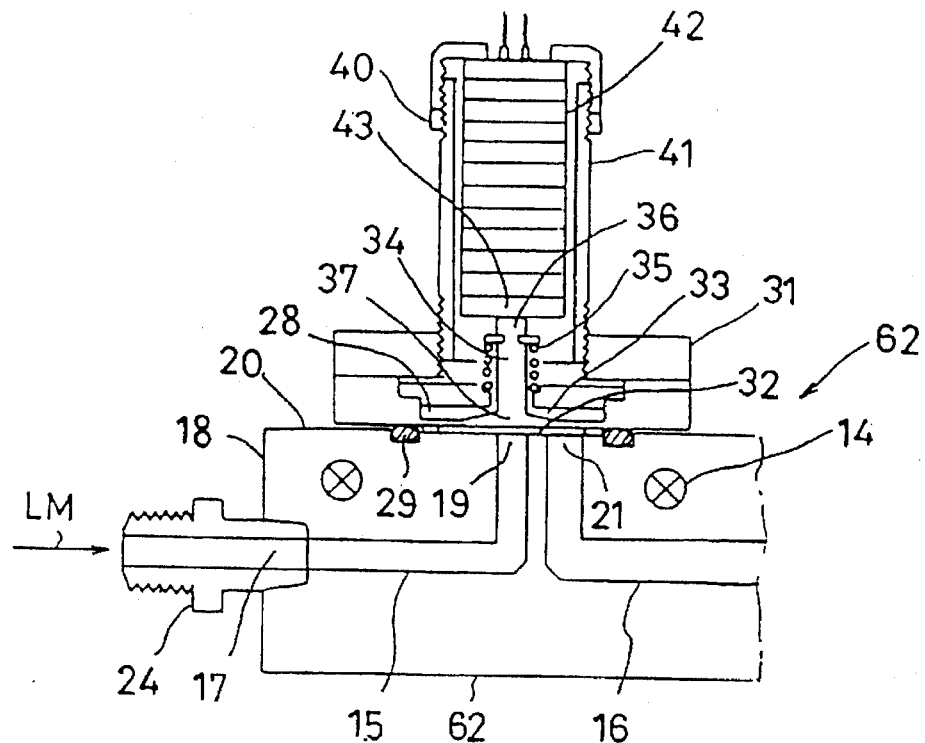
FIG. 13 is a longitudinal sectional view showing one example of a vaporizer used in said liquid material-vaporizing and supplying apparatus.

The vaporizer 63 is as shown in FIG. 13 but quite same as in the vaporizer 12 according to the first object in details thereof, so that the corresponding members are designated by the same reference numerals as in the vaporizer 12 according to the first invention and their descriptions are omitted.

Said gas flow meter 64 has the following construction. That is to say, referring to FIG. 12, reference numeral 65 designates a passage connected with the downstream side of the gas outlet passage 16 of the vaporizer 63, said passage 65 being communicated with a gas outlet port 66 formed in the body block 62 on the downstream side thereof, and a by-pass element 67 for forming a laminar condition being provided to form a by-pass passage. In addition, reference numeral 68 designates a joint connected with said gas outlet port 66.

And, the body block 62 is provided with openings 69 communicated with said by-pass passage 65 on the upstream side and downstream side of said by-pass element 67 so as to be opened on an upper surface of the body block 62 and a sensor-fixing base 70 is provided on said upper surface. Said sensor-fixing base 70 is detachably provided with two sleeves 71 having passages 71a communicated with said respective openings 69. Reference numeral 72 designates a sealing member.

Reference numeral 73 designates a flow rate sensor portion connected with said sleeves 71 by a method, such as resistance welding, and comprising fine tubes 74 as measuring passages standing vertically and in a reverse U letter-shape on the fixing base 70 and the body block 62 and two heat-sensitive resistors 75, 76 wound around outer peripheries of central horizontal portions 74a of said fine tubes 74. In addition, said heat-sensitive resistors 75, 76 are selected so as to be equal to each other in heat-sensitive characteristic and the like.

Reference numeral 77 designates a hermetic terminal provided on an upper surface of the sensor-fixing base 70 by a resistance welding and the like and the heat-sensitive resistors 75, 76 are connected with a bridge circuit of a gas flow rate-operating portion 79 through lead pins of said hermetic terminal 77. That is to say, the heat-sensitive resistors 75, 76 form a known bridge circuit together with a resistor of said gas flow rate-operating portion 79. Reference numeral 80 designates a sensor case for housing said flow rate sensor portion 73, the hermetic terminal 77 and the like therein to cover them.

In addition, the sleeves 71, the fine tubes 74 and the like are made of metals superior in corrosion resistance such as stainless steels, nickel and coval. Furthermore, for example the chamber of the apparatus for producing semiconductors is connected with said joint 68 through a pipe.

Reference numeral 81 designates a comparative controlling portion in which a detected flow rate of gas f from the gas flow rate-operating portion 79 is compared with a set value g to send a control signal c to the actuator 40 of the vaporizer 63 and its construction is same as that according to the third object.

In the above described liquid material-vaporizing and supplying apparatus, not only the same operations and effects as in the above described preferred embodiments of the third object are exhibited but also the following operations and effects are exhibited. That is to say, in this liquid material-vaporizing and supplying apparatus, the vaporizer 63 is connected with the gas flow meter 64 in series under the integrated condition, so that said heating pipe can be made unrequited and the apparatus can be small-sized as compared with a construction that the vaporizer 63 is connected with the gas flow meter 64 through the heating pipe and thus a speed arriving at the gas flow meter 64 is increased to improve the response even if a remarkably reduced flow rate of gas is generated. Consequently, a flow of vaporized gas G flowing through the gas outlet passage 16 can be stabilized and thus the vaporized gas G, which has been controlled to be constant in flow rate on the basis of said control signal c in said comparative controlling portion 81, can be always stably supplied to the chamber of the apparatus for producing semiconductors through the gas flow meter 64.

Since the above described high-speed response can be still further improved in the above described manner, an overshoot of gas flow rate at a rising time of vaporized gas G can be improved to measure and control the gas flow rate in remarkably high accuracy by means of the gas flow meter 64 and the comparative controlling portion 81 even in the case where the flow rate of gas supplied to the chamber is set to a very small quantity. This setting of the gas flow rate to said very small quantity is very effectively used in many cases where the thin capacity-insulating film of MOB-type semiconductor elements is formed.

In addition, the construction that heat is supplied to the gas flow meter 64 by the use of the heater 14 of the vaporizer 63 can be adopted, so that a heat capacity of a certain condition required for stably vaporizing various kinds of liquid material in the vaporizing portion of the vaporizer 63 or more can be supplied to the liquid material to easily obtain the vaporized gas G. Consequently, the pressure-drop of the gas flow rate control valve does not come into question and thus not only an advantage occurs in that it becomes unnecessary to use a large-sized gas flow rate control valve having a high CV value in order to suppress the pressure-drop to a remarkably low value but also the dewing within the gas flow meter 64 can be prevented and thus the apparatus can be still more small-sized and remarkably reduced in cost.

In the above described manner, in the above described liquid material-vaporizing and supplying apparatus, the gas, which has been controlled to be constant in flow rate, can be stably supplied to the chamber on and after the vaporizer 63 of the apparatus for producing semiconductors.

Figure 14:
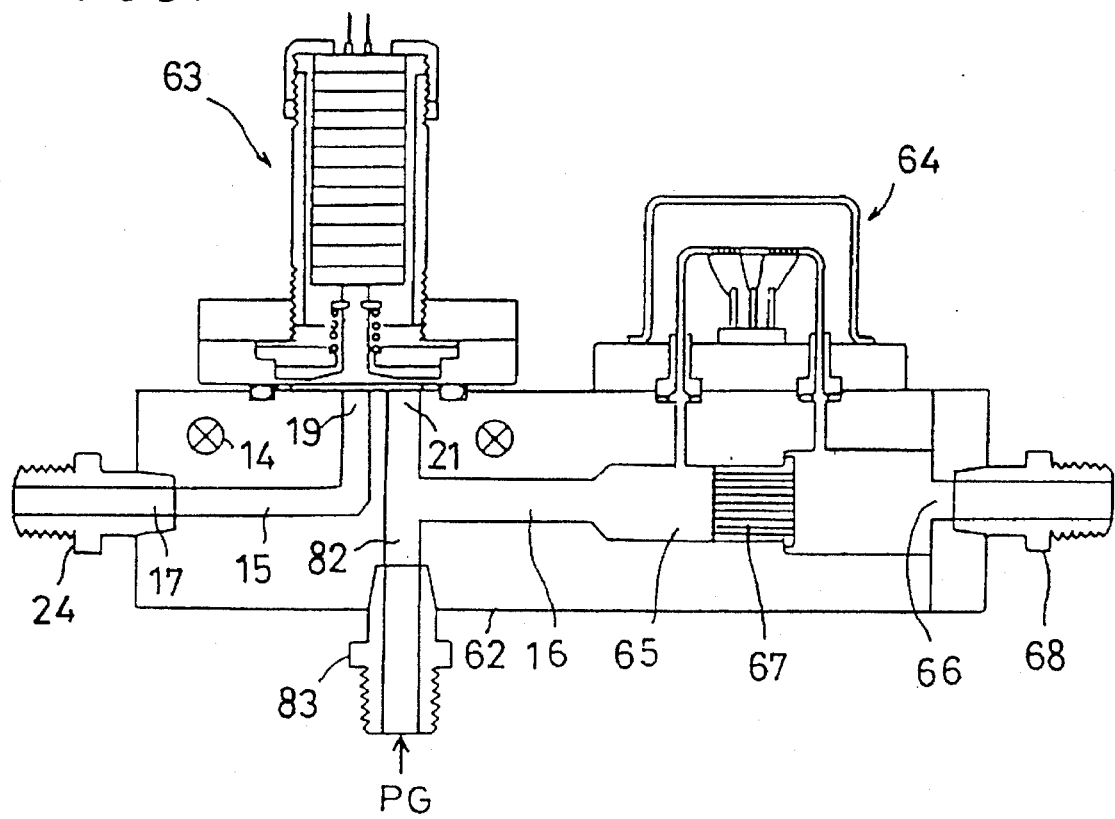
FIG. 14 is a drawing roughly showing a liquid material-vaporizing and supplying apparatus according to a second preferred embodiment of said fourth invention.
Figure 15:
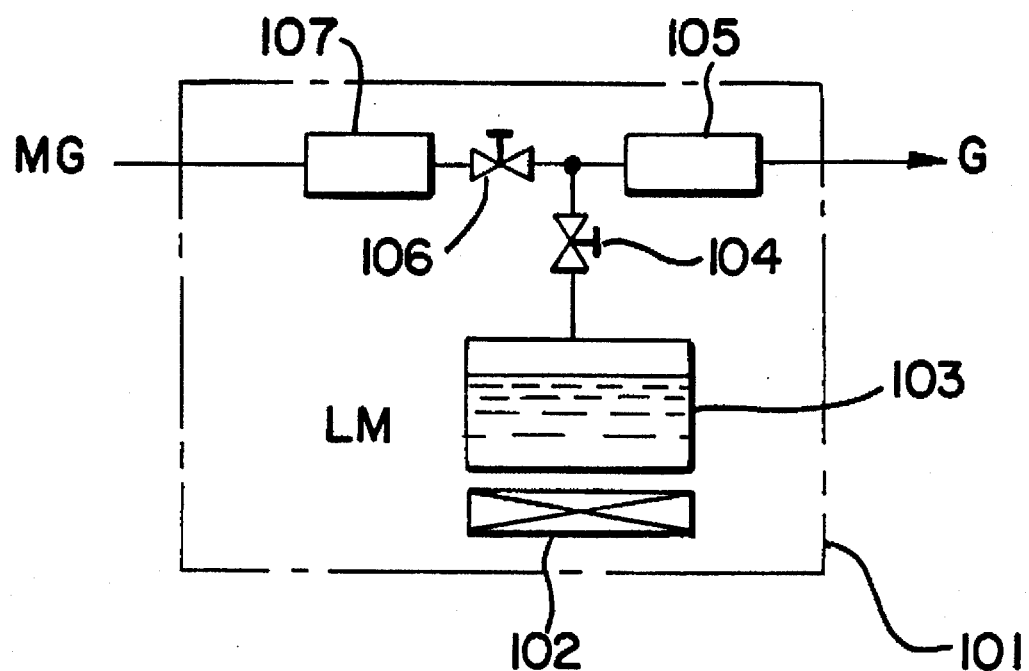
FIG. 15 is a drawing for explaining the conventional liquid material-vaporizing and supplying apparatus.
Figure 16:
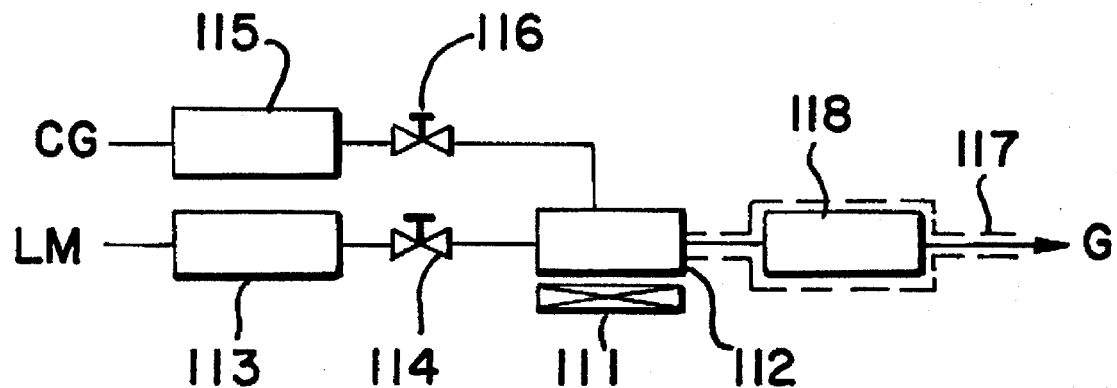
FIG. 16 is a drawing for explaining another conventional liquid material-vaporizing and supplying apparatus.

FIG. 14 roughly shows a liquid material-vaporizing and supplying apparatus according to a second preferred embodiment of the fourth object. Referring to FIG. 14, the same members as in FIG. 12 are designated by the same reference numerals as in FIG. 12, so that their descriptions are omitted.

Referring to FIG. 14, reference numeral 82 designates a gas purge line formed so as to be communicated with the gas outlet passage 16 in the body block 62 and provided with a joint 83 at an end portion thereof. For example, the purge gas PG flows through the gas outlet passage 16 during the maintenance and the rising time.

According to this second preferred embodiment, in the case where the liquid material LM has a remarkably high reactivity, for example oxygen and water remain on and after the vaporizer 63, a reaction makes progress in an instant and thus the possibility that solid substances and condensation products are formed is obtained. In this case, it comes into question that the gas flow meter 64 positioned on the secondary side of the vaporizer 63 is clogged and a shunting ratio is changed or the output is changed. Thus, in order to eliminate these problems, the lines on and after the vaporizer 63 can be effectively purged by previously flowing the purge gas PG through the gas purge line 82 before the liquid material LM is flown. Consequently, the line for supplying the apparatus for producing semiconductors with the vaporized gas can be satisfactorily operated by conducting this purge even in the case where air is mixed in the lines on and after the vaporizer by for example opening the chamber of the apparatus for producing semiconductors after the generation of vaporized gas G.

In addition, the fourth object is not limited by the above described preferred embodiments but various modified preferred embodiments of the first object and the third object can be applied as they are.

As above described, in the liquid material-vaporizing and supplying apparatus according to the fourth object, the following effects are exhibited in addition to the effects of the third object. That is to say, in the liquid material-vaporizing and supplying apparatus according to the fourth object, the vaporizer is connected with the gas flow meter in series under the integrated condition, so that the heating pipe can be made unnecessary as compared with the construction that an outlet of the vaporizer is connected with an inlet of the gas flow meter through the heating pipe and thus the apparatus can be small-sized. Consequently, a volume from the vaporizer to the gas flow rate portion within a vaporized gas-generating line formed so as to connect said outlet of the vaporizer with said inlet of the gas flow meter can be remarkably reduced and thus the speed arriving at the gas flow meter is increased to improve the response even if a remarkably reduced flow rate of gas is generated.

Consequently, the flow of vaporized gas flowing through the vaporized gas supply line can be stabilized and the vaporized gas controlled to be constant in flow rate in the comparative controlling portion can be always stably supplied to various kinds of use point through the gas flow meter. In the above described manner, the above described high-speed response can be still more improved, so that the overshoot of gas flow rate at the rising time of vaporized gas and the like can be improved to measure and control the gas flow rate in remarkably high accuracy by means of the gas flow meter and the comparative controlling portion even in the case where the flow rate of gas supplied to various kinds of use point is set to a very small quantity.

Moreover, in this liquid material-vaporizing and supplying apparatus according to the fourth object, the construction that heat is supplied to the gas flow meter by means of the heater of the vaporizer can be adopted, so that a heat capacity of certain condition required for stably vaporizing various kinds of liquid material in the vaporizing portion of the vaporizer or more can be supplied to the liquid material to easily obtain the vaporized gas. Consequently, the pressure-drop of the gas flow rate control valve does not come into question and thus not only an advantage occurs in that it becomes unnecessary to use a large-sized gas flow rate control valve having a high CV value in order to suppress the pressure-drop to a remarkably low value but also the dewing within the gas flow meter can be prevented and thus the apparatus can be still more small-sized and remarkably reduced in cost.

Moreover, in this integrated liquid material-vaporizing and supplying apparatus, in the case where the gas purge line for purging the gas outlet passage by the use of the purge gas is provided at the place where the vaporizer is connected with the gas flow meter, the following operations and effects are exhibited in addition to the above described operations and effects. That is to say, in the case where the liquid material has a remarkably high reactivity, for example oxygen and water remain on and after the vaporizer, a reaction makes progress in an instant and thus the possibility that solid substances and condensation products are formed is obtained. In this case, it comes into question that the gas flow meter positioned on the secondary side of the vaporizer is clogged and a dividing ratio is changed or the output is changed. Thus, in order to eliminate these problems, the lines on and after the vaporizer can be effectively purged by previously flowing the purge gas through the gas purge line before the liquid material is flown. Consequently, the line for supplying the apparatus for producing semiconductors with the vaporized gas can be satisfactorily operated by conducting this purge even in the case where air is mixed in the lines on and after the vaporizer by for example opening the chamber of the apparatus for producing semiconductors after the generation of vaporized gas.

What is claimed is:

1. A liquid material-vaporizing and supplying apparatus comprising:

a source of liquid material;

a liquid flow meter connected to the liquid material to provide a signal representative of the liquid material flow rate;

a vaporizer member connected in series with the liquid flow meter, the vaporizer member integrally including means for vaporizing the liquid material and means for adjusting the flow rate of the liquid material through the vaporizer member; and control means connected to the liquid flow ratio meter to compare the liquid material flow rate signal with a set flow rate and to drive the means for adjusting of the vaporizer member to match the set flow rate of liquid material.

2. The invention of claim 1 further including a movable diaphragm member wherein the means for vaporizing and the means for adjusting the flow rate both include the same movable diaphragm member.

3. The invention of claim 1 wherein the vaporizer member includes a vaporizing chamber with a movable diaphragm, a source of heat applied to the vaporizing chamber, an inlet port connected to the liquid material, a valve member connected to the movable diaphragm and operatively positioned to contact the inlet port, and means for driving the diaphragm to control the contact of the valve member with the inlet port, wherein the liquid material will be vaporized in conjunction with the heat in the vaporizing chamber as it is released through the inlet port.

4. The invention of claim 3 wherein the means for driving the diaphragm is a piezoactuator.

5. The invention of claim 3 wherein the diaphragm includes fluororesin material.

6. The invention of claim 3 wherein an outlet port is connected to the vaporizing chamber, and both the outlet port and the inlet port are on a side of the vaporizing chamber opposite the diaphragm.

7. The invention of claim 3 wherein a plurality of vaporizing chambers are interconnected together as the vaporizer member.

8. The invention of claim 1 further including a gas flow meter for providing a signal representative of the vaporized liquid material flow rate connected to a downstream side of the vaporizer member for measuring the gas flow from the vaporizer member.

9. The invention of claim 8 wherein the control means is connected to the gas flow meter to compare the gas flow meter signal with the set gas flow rate and the control means can drive the means for adjusting the vaporizer with either the comparison of the predetermined liquid material flow rate or the predetermined vaporized liquid material flow rate.

10. The invention of claim 9 wherein the source of heat is an oven chamber housing both the vaporizer member and the gas flow meter.

11. The invention of claim 9 wherein the vaporizer member and the gas flow meter are mounted on a common body member.

12. The invention of claim 9 wherein the gas flow meter includes a flow rate sensor monitoring a parallel flow of vaporized liquid material with a pair of heat sensitive resistors.

13. A liquid material-vaporizing and supplying apparatus for supplying a vapor from a source of liquid material comprising:

a liquid flow meter connected to the liquid material to provide a signal representative of the liquid material flow rate;

a vaporizer member connected in series with the liquid flow meter, the vaporizer member integrally including a vaporizing chamber with a movable diaphragm, a source of heat applied to the vaporizing chamber, an inlet port connected to the liquid material, a valve member connected to the movable diaphragm and operatively positioned to contact the inlet port, and means for driving the diaphragm to control the contact of the valve member with the inlet port, wherein the liquid material will be vaporized in conjunction with the heat in the vaporizing chamber as it is released through the inlet port; and control means connected to the liquid flow ratio meter to compare the liquid material flow rate signal with a set flow rate and to drive the valve member for adjusting the vaporizer member to match the set flow rate of liquid material.

14. The invention of claim 13 further including a source of purge gas and means for purging the liquid flow meter with the purge gas.

15. The invention of claim 13 wherein the diaphragm includes fluororesin material.

16. The invention of claim 13 wherein a plurality of vaporizing chambers are interconnected together as the vaporizer member.

17. The invention of claim 13 further including a gas flow meter for providing a signal representative of the vaporized liquid material flow rate connected to a downstream side of the vaporizer member for measuring the gas flow from the vaporizer member.

18. The invention of claim 17 wherein the control means is connected to the gas flow meter to compare the gas flow meter signal with a predetermined gas flow rate and the control means can drive the means for adjusting the vaporizer with either the comparison of the set liquid material flow rate or the set vaporized liquid material flow rate.

19. The invention of claim 18 wherein the source of heat is an oven chamber housing both the vaporizer member and the gas flow meter.

20. The invention of claim 18 wherein the gas flow meter includes a flow rate sensor monitoring a parallel flow of vaporized liquid material with a pair of heat sensitive resistors.

* * * * *